(12) United States Patent
Yun et al.

(10) Patent No.: US 12,543,565 B2
(45) Date of Patent: Feb. 3, 2026

(54) SEMICONDUCTOR DEVICE

(71) Applicant: SAMSUNG ELECTRONICS CO., LTD., Suwon-si (KR)

(72) Inventors: Ilhan Yun, Suwon-si (KR); Sung-Ki Lee, Suwon-si (KR); Hyekyoung Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 493 days.

(21) Appl. No.: 18/089,615

(22) Filed: Dec. 28, 2022

(65) Prior Publication Data
US 2023/0411238 A1    Dec. 21, 2023

(30) Foreign Application Priority Data
Jun. 17, 2022 (KR) .......... 10-2022-0074095

(51) Int. Cl.
*H01L 23/373* (2006.01)
*H05K 7/20* (2006.01)
*H10B 80/00* (2023.01)

(52) U.S. Cl.
CPC ..... *H01L 23/3735* (2013.01); *H05K 7/20436* (2013.01); *H05K 7/20509* (2013.01); *H10B 80/00* (2023.02)

(58) Field of Classification Search
CPC . H01L 23/3735; H01L 23/373; H01L 23/433; H01L 23/3675; H01L 23/053; H01L 23/3672; H01L 23/3677; H01L 25/0652; H01L 25/0655; H01L 25/18; H05K 7/20436; H05K 7/20509; H05K 7/20481; H10B 80/00; G06F 1/20; G11B 33/04; G11B 33/1426

See application file for complete search history.

(56) References Cited

U.S. PATENT DOCUMENTS

| | | | |
|---|---|---|---|
| 6,369,320 B1 | 4/2002 | Okamoto | |
| 7,372,704 B2 | 5/2008 | Jeong | |
| 9,958,914 B2 | 5/2018 | Kim | |
| 2014/0247554 A1 | 9/2014 | Sharma et al. | |
| 2017/0060199 A1* | 3/2017 | Kim | G06F 1/20 |
| 2018/0024600 A1 | 1/2018 | Horiuchi | |
| 2018/0204783 A1* | 7/2018 | Han | H05K 3/284 |

(Continued)

FOREIGN PATENT DOCUMENTS

CN 107657976 A 2/2018
GB 2552591 A 1/2018

*Primary Examiner* — Patricia D Valenzuela
(74) *Attorney, Agent, or Firm* — Fish & Richardson P.C.

(57) ABSTRACT

A solid state drive (SSD) includes a case including a planar portion, a protrusion portion protruding from the planar portion, and a plurality of fins protruding from the planar portion and defining an internal space, a printed circuit board located within the internal space of the case and including a semiconductor device and a controller, and a heat dissipation sheet covering the planar portion and the protrusion portion of the case. The plurality of fins are spaced apart from the protrusion portion and the printed circuit board in a first direction, an upper surface of the semiconductor device and an upper surface of the controller are in direct contact with the heat dissipation sheet, and the heat dissipation sheet includes at least one of graphite, graphene, carbon nanotubes, and fullerene.

20 Claims, 8 Drawing Sheets

(56) References Cited

U.S. PATENT DOCUMENTS

| | | |
|---|---|---|
| 2021/0015006 A1 | 1/2021 | Muto |
| 2021/0092871 A1 | 3/2021 | Hur et al. |
| 2021/0298212 A1 | 9/2021 | Mayer et al. |
| 2021/0334414 A1 | 10/2021 | Kwak et al. |

* cited by examiner

SEMICONDUCTOR DEVICE

CROSS-REFERENCE TO RELATED APPLICATIONS

A claim of priority under 35 U.S.C. § 119 is made to Korean Patent Application No. 10-2022-0074095, filed on Jun. 17, 2022, in the Korean Intellectual Property Office, the disclosure of which is incorporated herein by reference in its entirety.

BACKGROUND OF THE INVENTION

The inventive concept relates to a semiconductor device, and more particularly, to a solid state drive (SSD) case including a heat dissipation sheet.

A solid state drive (also known as a solid state disc) is a device for storing data using solid state memory such as flash memory, and is often used as a means to replace a conventional hard disk drive (HDD). Unlike to the conventional HDD, the SSD is devoid of mechanically moving parts. For this reason and others, the SSD exhibits a relatively high operating speed, reduced latency and reduced errors when compared to the HDD.

The SSD is generally provided in a form of a package in which memory chips are mounted on a printed circuit board (PCB), and the SSD package is embedded in a closed case or open case.

SUMMARY

According to an aspect of the inventive concepts, a solid state drive (SSD) is provided which includes a case including a planar portion, a protrusion portion protruding from the planar portion, and a plurality of fins protruding from the planar portion and defining an internal space, a printed circuit board located within the internal space of the case and including a semiconductor device and a controller, and a heat dissipation sheet covering the planar portion and the protrusion portion of the case. The plurality of fins are spaced apart from the protrusion portion and the printed circuit board in a first direction, an upper surface of the semiconductor device and an upper surface of the controller are in direct contact with the heat dissipation sheet, and the heat dissipation sheet includes at least one of graphite, graphene, carbon nanotubes, and fullerene.

According to another aspect of the inventive concept, a solid state drive (SSD) is provided which includes a first case portion including a first planar portion, a first protrusion portion protruding from the first planar portion, and a first plurality of fins protruding from the first planar portion, a second case portion including a second planar portion and coupled to the first case portion to provide an internal space, a printed circuit board disposed in the internal space and including a semiconductor device and a controller, and a first heat dissipation sheet covering the first planar portion, the first protrusion portion and the first plurality of fins of the first case portion. An upper surface of the semiconductor device and an upper surface of the controller are in direct contact with the first heat dissipation sheet.

According to yet another aspect of the inventive concepts, a semiconductor device is provided which includes a case including a planar portion, a protrusion portion protruding from the planar portion, and a plurality of fins protruding from the planar portion an internal surface, and defining an internal space and a heat dissipation slit, the internal surface including a planar portion, a protrusion portion protruding from the planar portion, and a plurality of fins protruding from the planar portion, a printed circuit board including a semiconductor device and a controller, and disposed in the internal space, and a heat dissipation sheet covering the planar portion and the protrusion portion of the inner surface of the case. The plurality of fins are disposed to be spaced apart from the protrusion portion and the printed circuit board in a first direction, the heat dissipation slit penetrates the case in the first direction and is disposed on a sidewall of the case adjacent to the plurality of fins, the planar portion, the protrusion portion and the plurality of fins are integral, and an upper surface of the semiconductor device and an upper surface of the controller are in direct contact with the heat dissipation sheet.

BRIEF DESCRIPTION OF THE DRAWINGS

Example embodiments will be more clearly understood from the detailed description that follows taken in conjunction with the accompanying drawings. The accompanying drawings represent non-limiting, example embodiments as described herein.

DETAILED DESCRIPTION

Figure 1:
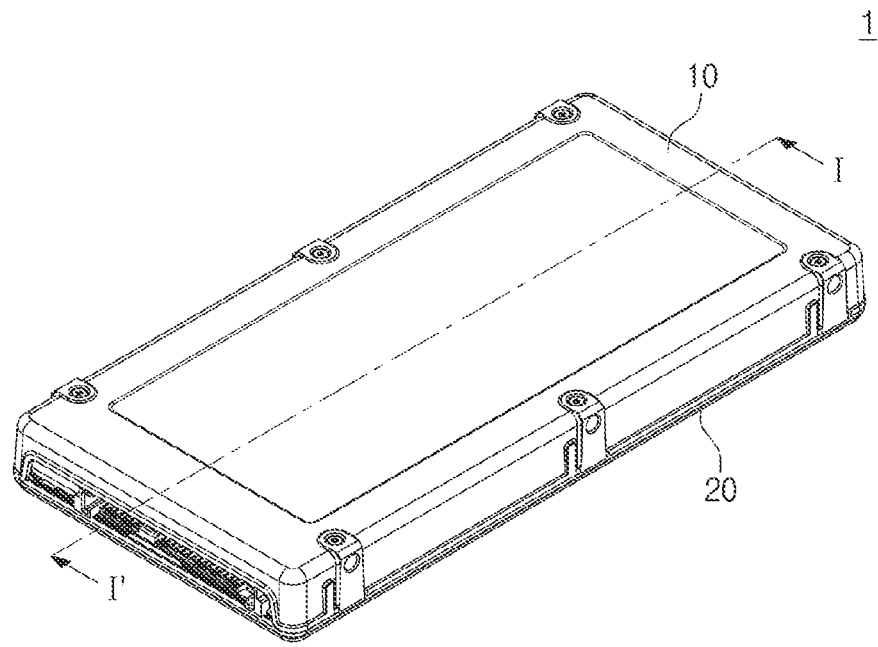
FIG. 1 is a diagram schematically illustrating a semiconductor device according to example embodiments.

Hereinafter, embodiments of the inventive concept will be described with reference to the accompanying drawings. Like reference numerals refer to like elements throughout the specification.

In the drawings of the present specification, some elements may be enlarged or reduced compared to actual proportions for convenience of description and concise illustration. That is, the drawings are not necessary drawn to scale, and sizes and proportions of the illustrated components may differ from actual sizes and proportions.

Figure 2:
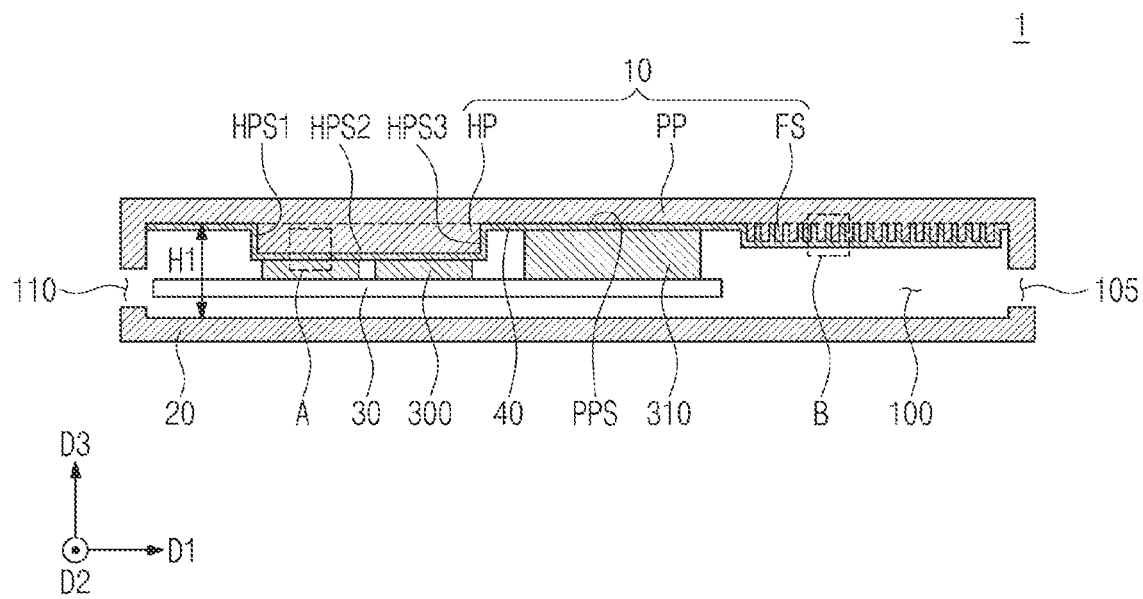
FIG. 2 is a cross-sectional view taken along line I-I' of FIG. 1 for reference in explaining a semiconductor device according to embodiments of the inventive concept.

FIG. 1 is a diagram schematically illustrating a semiconductor device according to example embodiments. FIG. 2 is a cross-sectional view taken along line I-I' of FIG. 1 for reference in explaining a semiconductor device according to embodiments of the inventive concept.

Referring to FIGS. 1 and 2, a semiconductor device 1 may include a first case portion a second case portion 20, a printed circuit board 30, and a heat dissipation sheet 40. The semiconductor device 1 may be a memory device. For example, the semiconductor device 1 may be a solid state drive SSD.

The first case portion 10 and the second case portion 20 may be assembled to each other to form a case which provides an internal space 100 between the first case portion 10 and the second case portion 20. The internal space 100 may have a first height H1 in a third direction D3. For example, the first case portion 10 may be an upper case, and the second case portion 20 may be a lower case, but embodiments are not limited in this fashion. Each of the first case portion 10 and the second case portion 20 may include a bottom surface and four sidewalls vertically protruding from the bottom surface. Although a height of the sidewalls of the first case portion 10 is higher than a height of the sidewalls of the second case portion 20 as an example, the inventive concept is not limited in this manner. The first and second case portions 10 and 20 may include aluminum (Al) and/or an aluminum alloy, and more specifically, die-casting aluminum and/or a die-casting aluminum alloy. The first case portion 10 may include the same materials as or different materials than the second case portion 20.

The printed circuit board 30 may be provided between the first case portion 10 and the second case portion 20. That is, the printed circuit board 30 may be disposed in the internal space 100. Semiconductor devices 300 and a controller 310 may be mounted on the printed circuit board 30. An upper surface of the printed circuit board 30 may face the bottom surface of the first case portion 10, and a lower surface of the printed circuit board 30 may face the bottom surface of the second case portion 20.

The semiconductor devices 300 may include a non-volatile memory chip, a buffer memory chip, and/or a passive device. The nonvolatile memory chip may include input/output pads for inputting and outputting signals, and may be electrically connected to the printed circuit board 30. The non-volatile memory chips may be, for example, NAND or VNAND flash memory chips. The buffer memory chip may be a volatile memory chip, for example, a dynamic random access memory (DRAM) chip, a phase-change random access memory (PRAM) chip, a resistive random access memory (RRAM) chip, a ferroelectric random access memory (FeRAM) chip, or a magnetic random access memory (MRAM) chip. The passive device may include at least one of a resistor, a capacitor, an inductor, a thermistor, an oscillator, a ferrite bead, an antenna, a varistor, and a crystal. However, the embodiments are not limited thereto and the passive device may be any one passive device. The passive device may be electrically connected to the controller 310 and the buffer memory chip through internal circuit wiring of the printed circuit board 30. Each of the semiconductor devices 300 may be of a different type. Thicknesses may be different in the third direction D3 depending on the types of the semiconductor devices 300.

The controller 310 may be disposed on one side of the printed circuit board 30. The controller 310 may include a central processing unit (CPU), an internal memory, a buffer memory control unit, a host interface, and a flash interface. The controller 310 may be electrically connected to the semiconductor devices 300. The controller 310 may include a program capable of sending and receiving signals to and from an external device in a manner based on a serial advanced technology attachment (SATA) standard, a parallel advanced technology attachment (PATA) standard, or a small computer system interface (SCSI) standard. Here, the SATA standard includes all SATA family standards, such as SATA-2, SATA-3, external SATA (e-SATA), as well as so-called SATA-1. The PATA standard encompasses all integrated drive electronics (IDE) family standards, such as integrated drive electronics (IDE) and enhanced-IDE (E-IDE). The number, size, thickness, and arrangement of the semiconductor devices 300 and the controller 310 shown in FIGS. 1 and 2 are merely exemplary and the embodiments are not limited thereto.

The first case portion 10 may include a planar portion PP, a protrusion portion HP, and a plurality of fins FS. The planar portion PP may have a bottom surface PPS. The bottom surface PPS of the planar portion PP may be the same as the bottom surface of the first case portion 10. That is, the bottom surface PPS of the planar portion PP may be connected to four sidewalls vertically protruding from the bottom surface PPS. The bottom surface PPS of the planar portion PP may face the upper surface of the printed circuit board 30.

The protrusion portion HP may have a shape protruding toward the printed circuit board 30 from the bottom surface PPS of the planar portion PP. The protrusion portion HP may have first to third surfaces HPS1, HPS2, and HPS3. The first surface HPS1 may face the third surface HPS3. The second surface HPS2 may face the upper surface of the printed circuit board 30. The second surface HPS2 may be larger than the first surface HPS1 or the third surface HS3. The second surface HPS2 of the protrusion portion HP may be closer to the printed circuit board 30 than the bottom surface PPS of the planar portion PP. The second surface HPS2 of the protrusion portion HP may be a corrugated surface including grooves, but embodiments are not limited thereto. The protrusion portion HP may be integral with the planar portion PP. Herein, "integral" means one-piece, as opposed to multiple pieces connected or fixed together. The protrusion portion HP may absorb heat generated by the semiconductor devices 300 through the heat dissipation sheet 40 and radiate the heat to the outside. In the inventive concept, the protrusion portion HP is illustrated as an example in a tetragonal shape, but the inventive concept is not limited to such a shape.

The plurality of fins FS may protrude from the bottom surface PPS of the planar portion PP toward the second case portion 20. The plurality of fins FS may be disposed to be spaced apart from the protrusion portion HP in a first direction D1. Also, the plurality of fins FS may be spaced apart from the printed circuit board 30 in the first and third directions D1 and D3. Each of the plurality of fins FS may extend in a second direction D2 and may be spaced apart from each other in the first direction D1. In contrast, each of the plurality of fins FS may extend in the first direction D1 and may be spaced apart from each other in the second direction D2. The plurality of fins FS may be integral with the protrusion portion HP and the planar portion PP. The plurality of fins FS may absorb the heat generated by the semiconductor devices 300 and the controller 310 through the heat dissipation sheet 40 and radiate the heat to the outside. That is, the plurality of fins FS may function as a heat sink absorbing the heat generated by the semiconductor device 1, the heat may be radiated to the outside through a heat dissipation slit 105 adjacent thereto. Each of the plurality of fins FS may have various shapes, examples of which will be described in detail with reference to FIGS. 5A to 5C.

The heat dissipation sheet 40 may be disposed between the protrusion portion HP and the semiconductor devices 300, and may cover the first to third surfaces HPS1, HPS2, and HPS3 of the protrusion portion HP. In addition, the heat dissipation sheet 40 may be disposed between the planar portion PP and the controller 310 and may cover the bottom surface PPS of the planar portion PP. A thickness of the heat dissipation sheet 40 covering the first to third surfaces HPS1, HPS2, and HPS3 of the protrusion portion HP and the bottom surface PPS of the planar portion PP may be uniform. The heat dissipation sheet 40 may cover each of the plurality of fins FS, examples of which will be described in detail with reference to FIGS. 5A to 5C. The heat dissipation sheet 40 may transfer the heat generated by the semiconductor devices 300 and the controller 310 to the protrusion portion HP and the plurality of fins FS. The heat dissipation sheet 40 may include at least one of graphite, graphene, carbon nanotube, and fullerene. The thickness of the heat dissipation sheet 40 may be about 0.1 mm to about 0.26 mm A thermal conductivity of the heat dissipation sheet in a horizontal direction may be about 1,500 W/mK. Alternatively, a thermal conductivity of the heat dissipation sheet 40 in the vertical direction may be about 10 W/mK. Meanwhile, the heat dissipation sheet 40 may block electromagnetic waves generated from the semiconductor devices 300 and the controller 310 from affecting the outside. That is, the heat dissipation sheet 40 may improve the heat dissipation characteristics and electromagnetic wave interference (EMI) shielding characteristics of the semiconductor device 1.

Figure 3A:
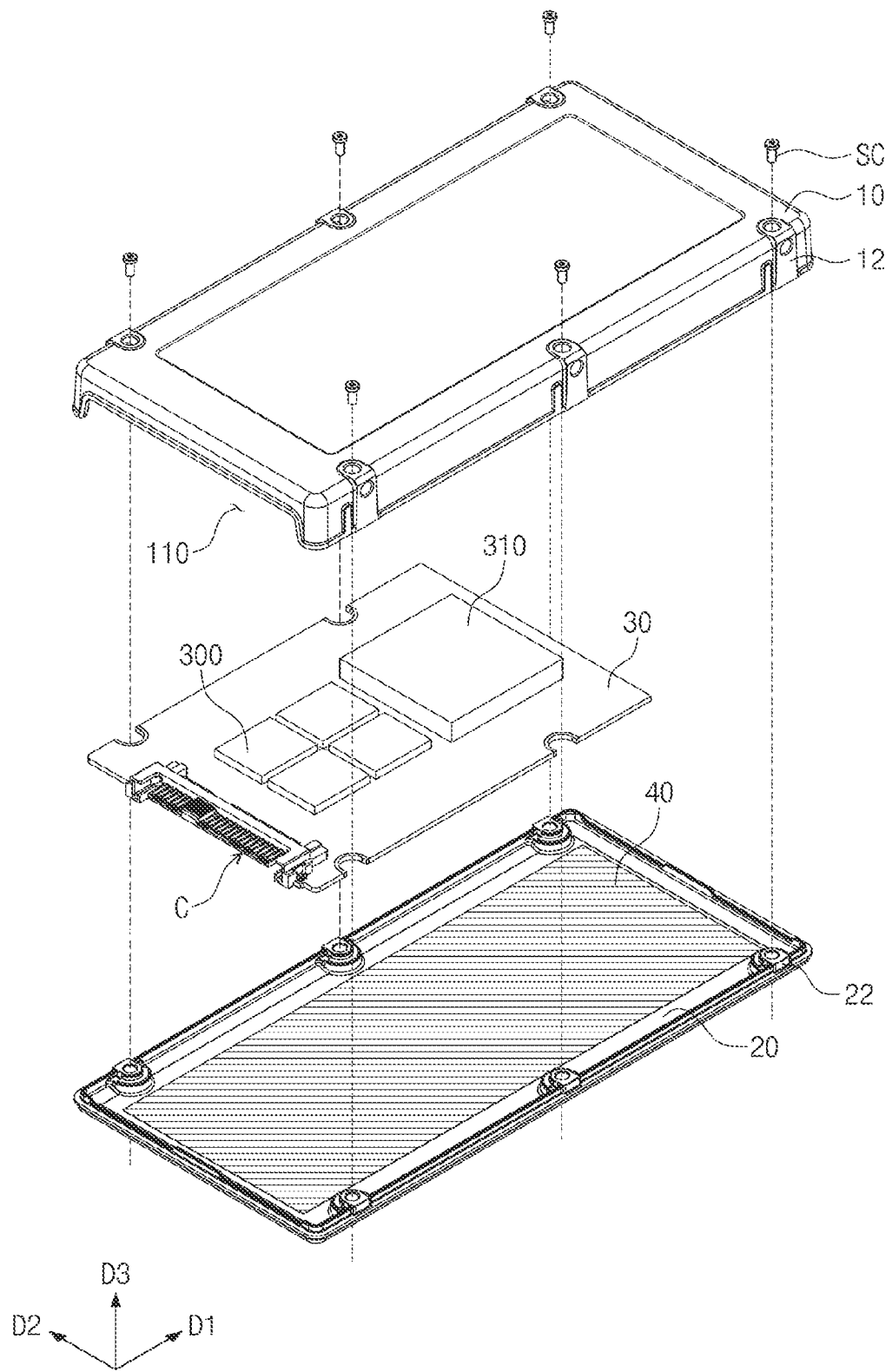
FIG. 3A is an exploded perspective view of the semiconductor device of FIG. 1 viewed in a top view.
Figure 3B:
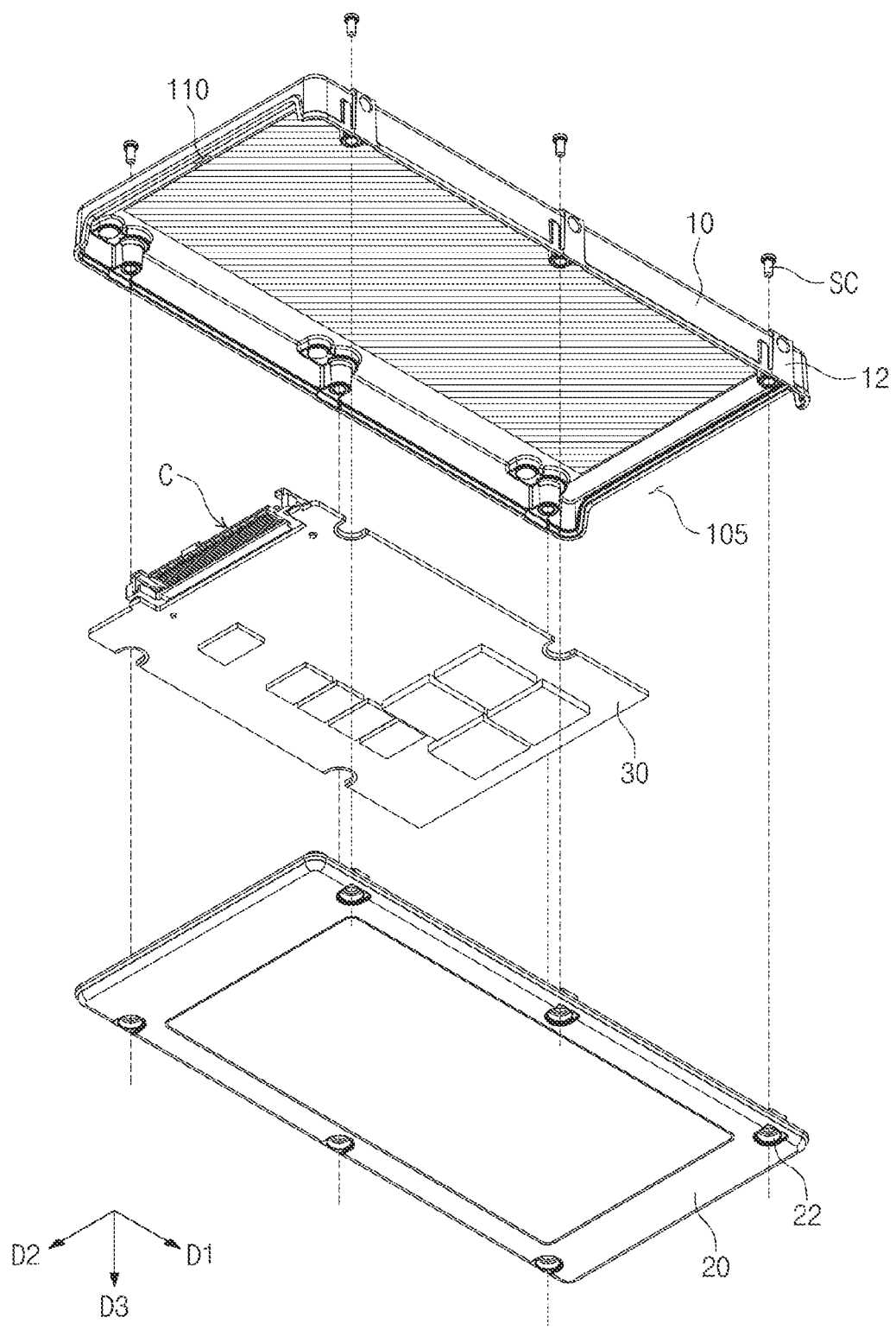
FIG. 3B is an exploded perspective view of the semiconductor device of FIG. 1 viewed in a bottom view.

FIG. 3A is an exploded perspective view of the semiconductor device of FIG. 1 viewed in a top view. FIG. 3B is an exploded perspective view of the semiconductor device of FIG. 1 viewed in a bottom view.

Referring to FIGS. 3A and 3B, the first case portion 10 may include first coupling units 12. Some of the first coupling units 12 may couple the first case portion 10 to the printed circuit board 30 and the second case portion 20. The remaining first coupling units 12 may couple only the first case portion 10 and the second case portion 20. For example, the first coupling units 12 may be screw hole insert parts. The first case portion 10 may provide a contact slit 110 and a heat dissipation slit 105 penetrating the sidewall of the first case portion 10 in the first direction D1. A length of each of the contact slit 110 and the heat dissipation slit 105 in the second direction D2 may be relatively greater than a length in the third direction D3. Lengths of the contact slit 110 and the heat dissipation slit 105 in the third direction D3 may be smaller than the thickness of the first case portion 10. Each of the contact slit 110 and the heat dissipation slit 105 may be provided on each of the opposite sidewalls. The contact slit 110 may be provided on a sidewall adjacent to the printed circuit board 30. The heat dissipation slit 105 may be provided on a sidewall adjacent to the plurality of fins (FS of FIG. 2). When the first case portion 10 and the second case portion are assembled, a connector C of the printed circuit board 30 may pass through the contact slit 110 and be exposed to the outside. The printed circuit board 30 may be electrically connected to an external device or an electronic device through the connector C. A size of the contact slit 110 may be the same as a size of the heat dissipation slit 105.

The second case portion 20 may include second coupling units 22. Each of the second coupling units 22 may be provided at a position corresponding to each of the first coupling units 12 of the first case portion 10. Some of the second coupling units 22 may couple the second case portion 20 to the printed circuit board 30 and the first case portion 10. The remaining second coupling units 22 may couple only the second case portion 20 and the first case portion 10. For example, the second coupling units 22 may be screw hole fastening part. When the first case portion 10 and the second case portion 20 are assembled to each other, the second coupling units 22 are inserted into the first coupling units 12, and screws SC are provided to fix the first case portion 10 and the second case portion 20 together.

Figure 4:
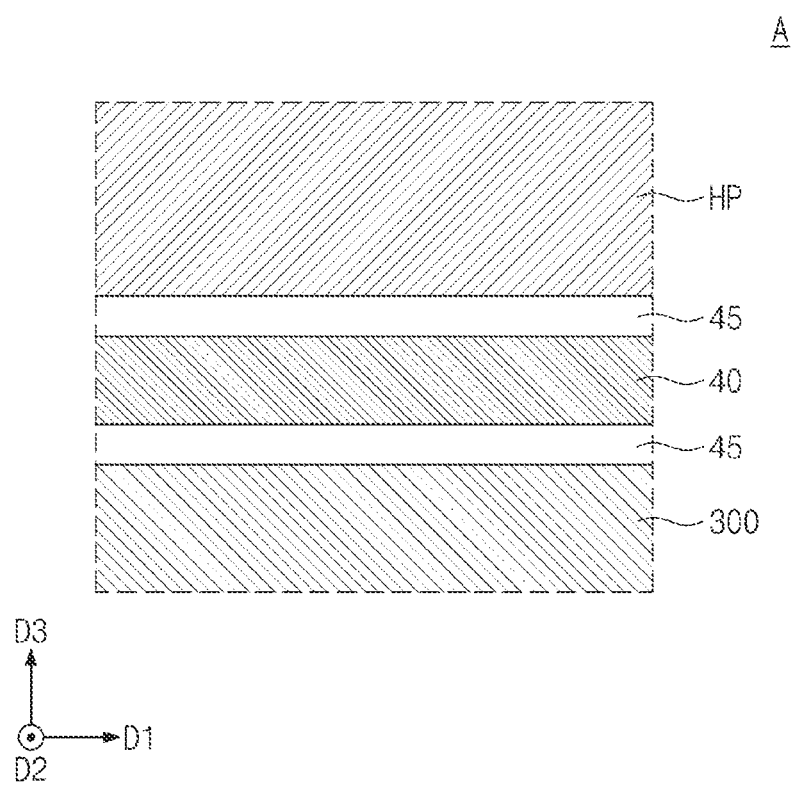
FIG. 4 is an enlarged view showing an example of a portion "A" of FIG. 2.

FIG. 4 is an enlarged view of an example of portion A of FIG. 2.

Referring to FIG. 4, the heat dissipation sheet 40 may be disposed between the protrusion portion HP of the first case portion 10 and the semiconductor devices 300. An adhesive sheet 45 may be disposed between the protrusion portion HP and the heat dissipation sheet 40 and between the semiconductor devices 300 and the heat dissipation sheet 40. The heat dissipation sheet 40 may be attached to the second surface HPS2 of the protrusion portion HP through the adhesive sheet 45. The heat dissipation sheet 40 may be attached to the upper surfaces of the semiconductor devices 300 through the adhesive sheet 45. The heat generated by the semiconductor devices 300 may be transferred to the heat dissipation sheet 40, and may travel in the third direction D3 toward the protrusion portion HP of the first case portion 10, or may travel in the first direction D1 or the second direction D2 inside the heat dissipation sheet 40. The adhesive sheet 45 may be, for example, an acrylic tape, but embodiments are not limited thereto.

Referring to FIGS. 2 and 4, the adhesive sheet 45 may be provided between the bottom surface PPS of the planar portion PP, the first and third surfaces HPS1 and HPS3 of the protrusion portion HP, and the upper surface of the controller 310, and the heat dissipation sheet 40. A size of the adhesive sheet 45 may be the same as or smaller than a size of the heat dissipation sheet 40. According to another embodiment of the inventive concept, the adhesive sheet 45 may be excluded between the heat dissipation sheet 40 and the semiconductor devices 300 and between the heat dissipation sheet 40 and the controller 310.

Figure 5A:
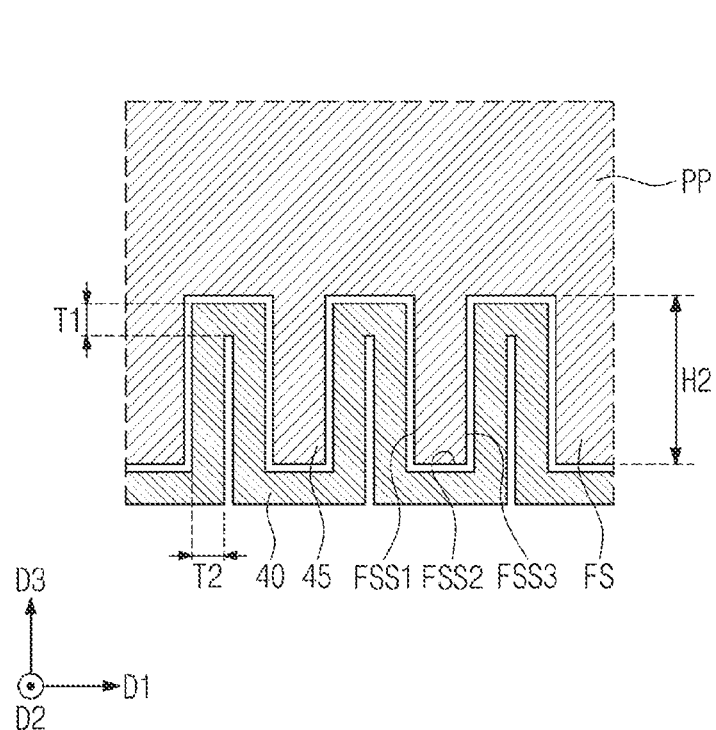
FIGS. 5A to 5C are enlarged views showing respective examples of a portion "B" of FIG. 2.
Figure 5B:
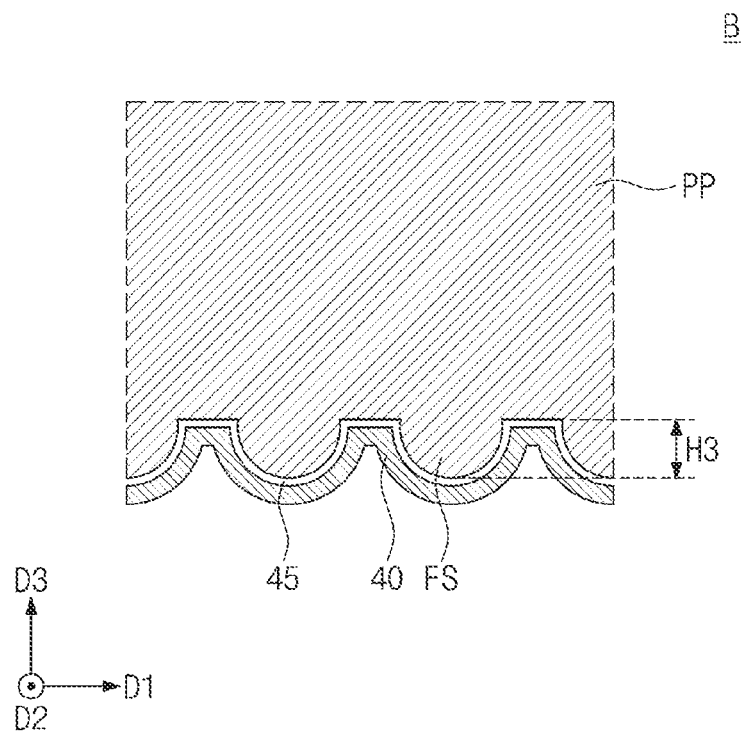
Figure 5C:
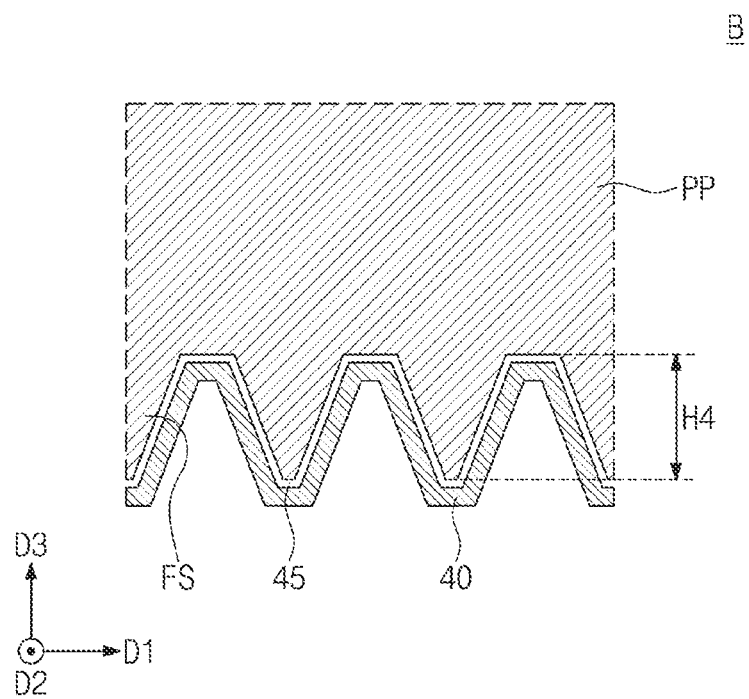

FIGS. 5A to 5C are enlarged views of respective examples of portion "B" of FIG. 2.

Referring to FIG. 5A, according to an embodiment of the inventive concept, each of the plurality of fins FS may have a tetragonal shape. Each of the plurality of fins FS may have first to third surfaces FSS1, FSS2, and FSS3. The first surface FSS1 of each of the plurality of fins FS may face the third surface FSS3. The second surface FSS2 of each of the plurality of fins FS may face the second case portion 20 of FIG. 2. The heat dissipation sheet 40 may have a first thickness T1 in the third direction D3. The heat dissipation sheet may have a second thickness T2 in the first direction D1. The first thickness T1 and the second thickness T2 may be substantially the same. That is, the heat dissipation sheet 40 may cover the first to third surfaces FFS1, FFS2, and FFS3 of each of the plurality of fins FS and a portion of the planar portion PP with a uniform thickness. Each of the plurality of fins FS may have a second height H2 in the third direction D3.

Referring to FIG. 5B, according to another embodiment of the inventive concept, each of the plurality of fins FS may have a semicircular cross-sectional shape. Each of the plurality of fins FS may have a convex surface toward the second case (20 of FIG. 2). The heat dissipation sheet 40 may cover a portion of the planar portion PP and the convex surface of each of the plurality of fins FS. Each of the plurality of fins FS may have a third height H3 in the third direction D3.

Referring to FIG. 5C, according to another embodiment of the inventive concept, each of the plurality of fins FS may have a triangular cross-sectional shape. Each of the plurality of fins FS may have a shape protruding toward the second case (20 in FIG. 2). Each of the plurality of fins FS may have two surfaces. The heat dissipation sheet 40 may cover a portion of the planar portion PP and the two surfaces of each of the plurality of fins FS. Each of the plurality of fins FS may have a fourth height H4 in the third direction D3. Referring to FIGS. 5A to 5C, the planar portion PP and the plurality of fins FS may be integrally formed. The adhesive sheet 45 may be disposed between the heat dissipation sheet 40 and the plurality of fins FS and between the heat dissipation sheet 40 and a portion of the planar portion PP. The second height H2 may be greater than the fourth height H4, and the fourth height H4 may be greater than the third height H3. That is, the height of the plurality of fins FS may vary depending on the shape of the plurality of fins FS, and the second to fourth heights H2, H3, and H4 may be smaller than the first height (H1 of FIG. 2) of the internal space (100 of FIG. 2) of the semiconductor device. In detail, the second to fourth heights H2, H3, and H4 may be about 0.4 to 0.6 of the first height (H1 in FIG. 2). This is for the heat transferred to the plurality of fins FS to be smoothly radiated to the heat dissipation slit 105 in FIG. 2.

A surface area of the first case (10 of FIG. 2) may be increased by the plurality of fins FS. As the height of the plurality of fins FS in the third direction D3 increases, the surface area of the first case (10 of FIG. 2) may increase. As the surface area of the first case (10 in FIG. 2) increases, the area in contact with the heat dissipation sheet 40 may increase, and thus the heat dissipation function may be improved. However, as the height of the plurality of fins FS increases, a contact with the heat dissipation sheet 40 may be unstable, and thus the heat dissipation function may be deteriorated. Although the shape of each of the plurality of fins FS has been described in FIGS. 5A to 5C, the inventive concept is not limited thereto.

Figure 6A:
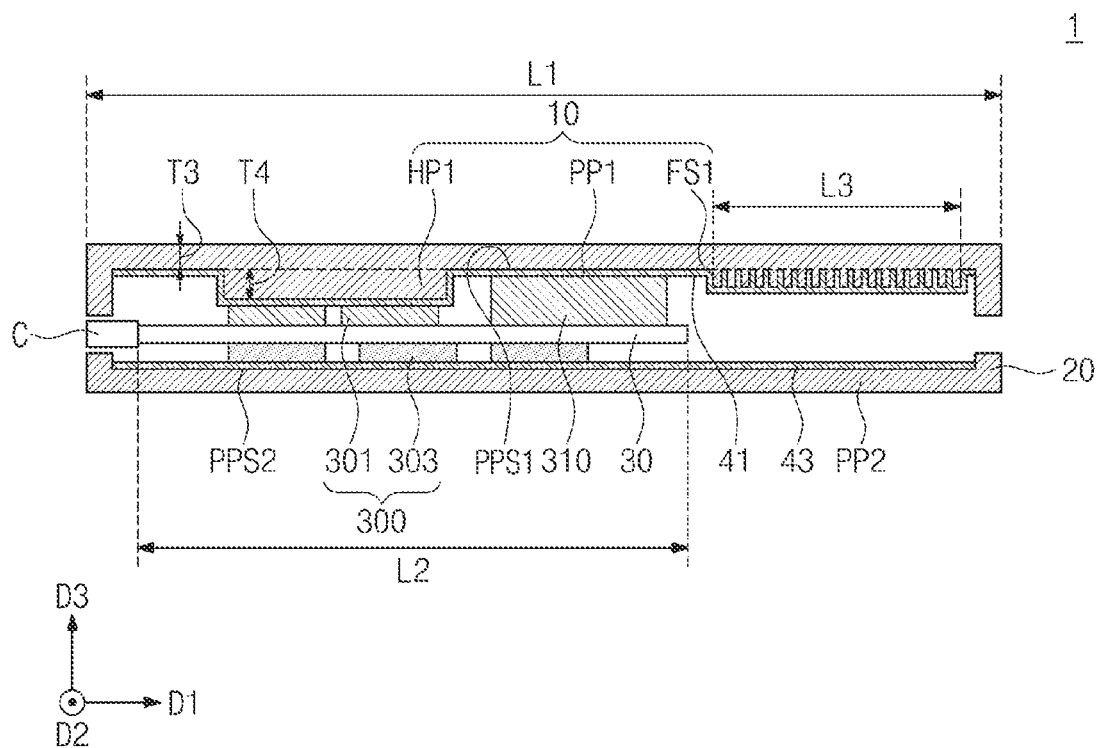
FIGS. 6A to 6C are cross-sectional views taken along line I-I' of FIG. 1 for reference in explaining a semiconductor device according to other embodiments of the inventive concept.
Figure 6B:
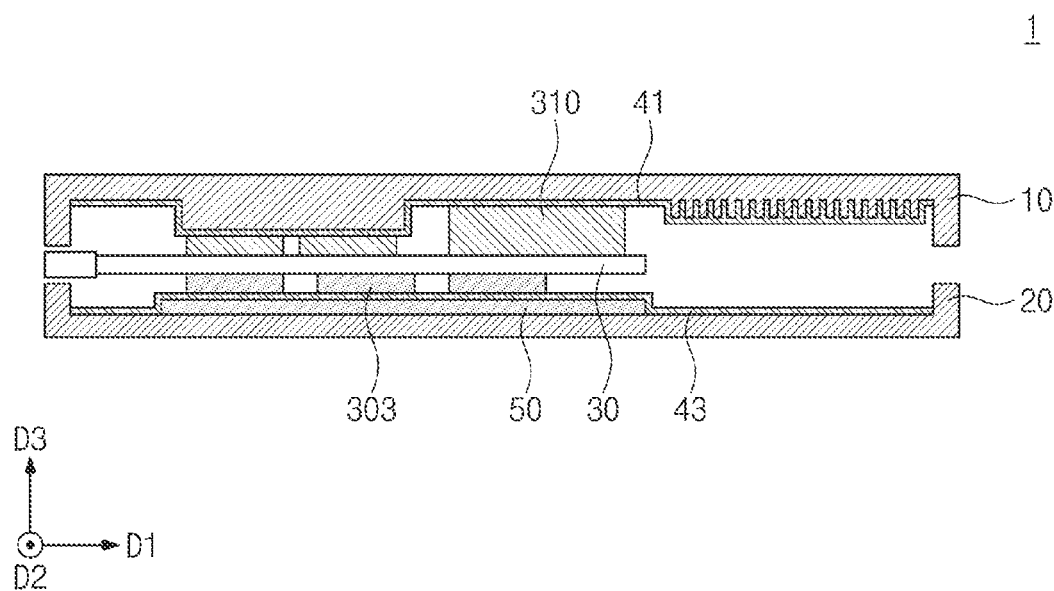
Figure 6C:
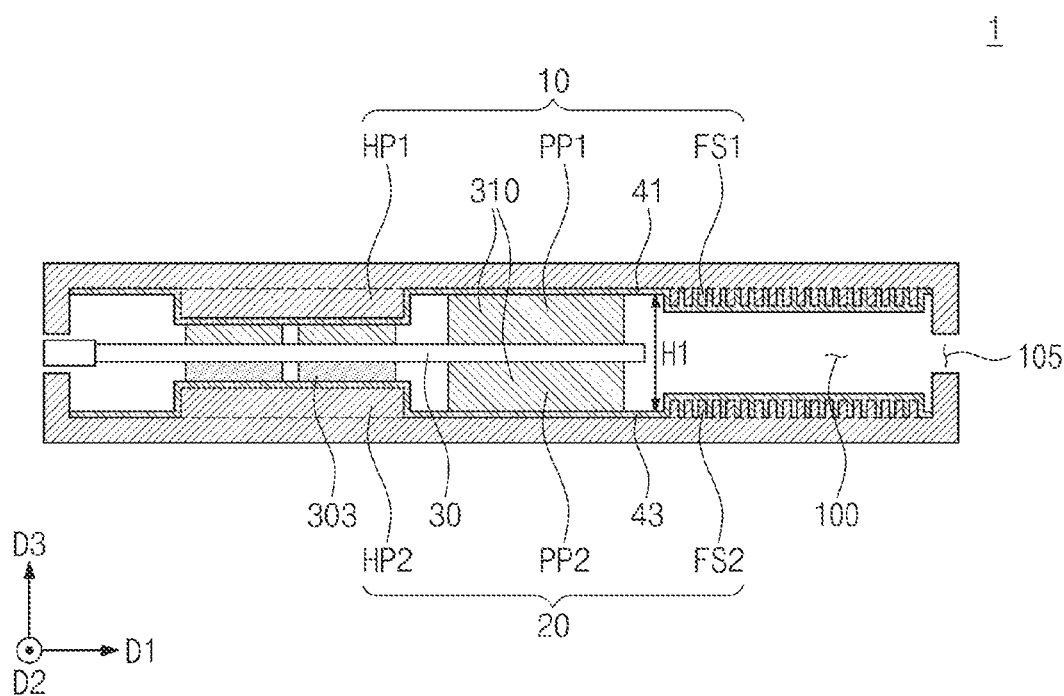

FIGS. 6A to 6C are cross-sectional views taken along line I-f of FIG. 1 for reference in explaining semiconductor devices according to other embodiments of the inventive concept. A description of elements that have already been described is omitted below to avoid redundancy in the description.

Referring to FIG. 6A, the semiconductor devices 300 may be mounted on the printed circuit board 30. The semiconductor devices 300 may include first semiconductor devices 301 and second semiconductor devices 303. The first semiconductor devices 301 may be mounted on the upper surface of the printed circuit board 30, and the second semiconductor devices 303 may be mounted on the lower surface of the printed circuit board 30. The first and second semiconductor devices 301 and 303 may include a nonvolatile memory chip, a buffer memory chip, and/or a passive device. Each of the first and second semiconductor devices 301 and 303 may be electrically connected to the printed circuit board 30. The first semiconductor devices 301 may be different types of semiconductor devices from the second semiconductor devices 303. For example, the first semiconductor devices 301 may be nonvolatile memory chips, and the second semiconductor devices 303 may be buffer memory chips and/or passive devices. The printed circuit board 30 may have a second length L2 in the first direction D1.

The first case portion 10 may include a first planar portion PP1, a first protrusion portion HP1, and a first plurality of fins FS1. Alternatively, the second case portion 20 may include a second planar portion PP2. The first and second case portions 10 and 20 may have a first length L1 in the first direction DE The first plurality of fins FS1 of the first case portion 10 may have a third length L3 in the first direction DE The sum of the second length L2 of the printed circuit board 30 and the third length L3 of the first plurality of fins FS1 may be smaller than the first length L1 of the first case portion 10. That is, the first plurality of fins FS1 may not be directly affected by the heat generated by the semiconductor devices 300 and the controller 310 mounted on the printed circuit board 30. The first planar portion PP1 of the first case portion 10 may have a third thickness T3 in the third direction D3. The first protrusion portion HP1 of the first case portion 10 may have a fourth thickness T4 in the third direction D3. The third thickness T3 and the fourth thickness T4 may be substantially the same. The sum of the fourth thickness T4 of the first protrusion portion HP1 and the thickness of the first semiconductor devices 301 may be substantially equal to the thickness of the controller 310.

A first heat dissipation sheet 41 may be disposed between the printed circuit board 30 and the first case portion 10. The first heat dissipation sheet 41 may cover the first protrusion portion HP1, the first planar portion PP1, and the first plurality of fins FS1. The first heat dissipation sheet 41 may be in contact with upper surfaces of the first semiconductor devices 301 and the controller 310. A second heat dissipation sheet 43 may be disposed between the printed circuit board 30 and the second case portion 20. The second heat dissipation sheet 43 may cover the second planar portion PP2. That is, the second heat dissipation sheet 43 may be in contact with the bottom surface PPS2 of the second planar portion PP2. The second heat dissipation sheet 43 may be in contact with upper surfaces of the second semiconductor devices 303. The first and second heat dissipation sheets 41 and 43 may be formed of the same material as the heat dissipation sheet 40 of FIG. 2. The heat generated by the second semiconductor devices 303 may be radiated to the outside through the second heat dissipation sheet 43. Although not shown in FIG. 6A, an adhesive sheet (45 in FIG. 4) may be provided between the first heat dissipation sheet 41 and the first case portion 10 and between the second heat dissipation sheet 43 and the second case portion 20.

Referring to FIG. 6B, a heat dissipation plate 50 may be provided between the printed circuit board 30 and the second case portion 20. A length of the heat dissipation plate 50 in the first direction D1 may be smaller than a length of the printed circuit board 30 in the first direction D1. The heat generated by the second semiconductor devices 303 may be transmitted to the heat dissipation plate 50 through the second heat dissipation sheet 43. The heat dissipation plate 50 may absorb the heat generated from the second semiconductor devices 303 and radiate the heat to the outside. The heat dissipation plate 50 may be, for example, Silicone TIM (thermal interface material) or Acrylate TIM, but embodiments are not limited thereto. Although not shown in FIG. 6B, an adhesive sheet (45 in FIG. 4) may be provided between the second heat dissipation sheet 43 and the heat dissipation plate 50.

Referring to FIG. 6C, the second case portion 20 may further include a second protrusion portion HP2 and a second plurality of fins FS2. That is, the second case portion may be symmetrical to the first case portion 10. For example, a separate controller 310 may be mounted on the lower surface of the printed circuit board 30 in addition to the second semiconductor devices 303. The first heat dissipation sheet 41 may be disposed between the first protrusion portion HP1 of the first case portion 10 and the first semiconductor devices 301 and between the controller 310 and the first planar portion PPE The second heat dissipation sheet 43 may be disposed between the second protrusion portion HP2 of the second case portion 20 and the second semiconductor devices 303 and between the controller 310 and the second planar portion PP2. As illustrated in FIG. 2, the second heat dissipation sheet 43 may cover the second planar portion PP2, the second protrusion portion HP2, and the second plurality of fins FS2. The shape of each of the first and second plurality of fins FS1 and FS2 may vary as described previously with reference to FIGS. 5A to 5C. The shapes of the first and second plurality of fins FS1 and FS2 may be the same as or different from each other. That is, the height of the first plurality of fins FS1 in the third direction D3 may be the same as or different from the height of the second plurality of fins FS2 in the third direction D3. The sum of the height of the first plurality of fins FS1 and the height of the second plurality of fins FS2 may be smaller than the first height H1 of the internal space 100 of the semiconductor device 1. This is for the heat transferred to the first and second plurality of fins FS1 and FS2 to be smoothly radiated to the heat dissipation slit 105. Although not shown in FIG. 6C, an adhesive sheet (45 in FIG. 4) may be provided between the first case portion 10 and the first heat dissipation sheet 41 and between the second case portion 20 and the second heat dissipation sheet 43.

According to embodiments of the inventive concept, the heat dissipation sheet may be included in the semiconductor device. The heat dissipation sheet may allow the heat generated in the semiconductor memory to be transferred to the protrusion and the fin structure, thereby improving the heat dissipation function of the semiconductor device. In addition, the heat dissipation sheet may prevent or inhibit electromagnetic interference (EMI) between the semiconductor device and other electronic devices.

While embodiments are described above, a person skilled in the art may understand that many modifications and variations are made without departing from the spirit and scope of the inventive concept defined in the following claims. Accordingly, the example embodiments of the inventive concept should be considered in all respects as illustrative and not restrictive, with the spirit and scope of the inventive concept being indicated by the appended claims.

What is claimed is:

1. A solid state drive (SSD) comprising:
a case including a planar portion, a protrusion portion protruding from the planar portion, and a plurality of fins protruding from the planar portion and defining an internal space;
a printed circuit board located within the internal space of the case and including a semiconductor device and a controller; and
a heat dissipation sheet covering the planar portion and the protrusion portion of the case,
wherein the plurality of fins are spaced apart from the protrusion portion and the printed circuit board in a first direction,
wherein an upper surface of the semiconductor device and an upper surface of the controller are in direct contact with the heat dissipation sheet, and
wherein the heat dissipation sheet includes at least one of graphite, graphene, carbon nanotubes, and fullerene.

2. The SSD of claim 1, wherein the protrusion portion of the case protrudes toward the semiconductor device and has first to third surfaces,
wherein the first surface and the third surface are perpendicular to the planar portion,
wherein the second surface is parallel to the planar portion and faces the upper surface of the semiconductor device, and
wherein the second surface of the protrusion portion and the upper surface of the semiconductor device are in direct contact with opposite sides of the heat dissipation sheet.

3. The SSD of claim 2, wherein the heat dissipation sheet has a uniform thickness, and is in contact with the first to third surfaces of the protrusion portion of the case.

4. The SSD of claim 1, wherein the planar portion and the protrusion portion are integrated.

5. The SSD of claim 1, further comprising an adhesive sheet between the heat dissipation sheet and the case.

6. The SSD of claim 1, wherein each of the plurality of fins has at least one surface, and
wherein the heat dissipation sheet covers the surface of each of the plurality of fins.

7. The SSD of claim 1, wherein the planar portion, the protrusion portion, and the plurality of fins are integrated.

8. The SSD of claim 1, wherein a height of each of the plurality of fins is about 0.4 to 0.6 of a height of the internal space of the case.

9. The SSD of claim 1, wherein the case provides a heat dissipation slit penetrating the case in the first direction, and
wherein the heat dissipation slit is disposed on a sidewall of the case adjacent to the plurality of fins.

10. The SSD of claim 1, wherein the semiconductor device includes a non-volatile memory chip, and
wherein the semiconductor device and the controller are electrically connected.

11. A solid state drive (SSD) comprising:
a first case portion including a first planar portion, a first protrusion portion protruding from the first planar portion, and a first plurality of fins protruding from the first planar portion;
a second case portion including a second planar portion and coupled to the first case portion to provide an internal space;
a printed circuit board disposed in the internal space and including a semiconductor device and a controller; and
a first heat dissipation sheet covering the first planar portion, the first protrusion portion and the first plurality of fins of the first case portion,
wherein an upper surface of the semiconductor device and an upper surface of the controller are in direct contact with the first heat dissipation sheet.

12. The SSD of claim 11, wherein a length of the first and second case portions in a first direction is greater than a length of the printed circuit board in the first direction.

13. The SSD of claim 11, wherein the semiconductor device includes a first semiconductor device and a second semiconductor device,
wherein the first semiconductor device is mounted on the upper surface of the printed circuit board, and the second semiconductor device is mounted on a lower surface of the printed circuit board, and
further comprising a second heat dissipation sheet covering a bottom surface of the second case portion and in contact with the upper surface of the second semiconductor device.

14. The SSD of claim 13, further comprising a heat dissipation plate between the second semiconductor device and the second case portion.

15. The SSD of claim 13, further comprising an adhesive sheet between the first case portion and the first heat dissipation sheet and between the second case portion and the second heat dissipation sheet.

16. The SSD of claim 13, wherein the second case portion further includes a second protrusion portion protruding from the second planar portion, and a second plurality of fins protruding from the second planar portion, and
wherein the second heat dissipation sheet covers the second protrusion portion and the second plurality of fins.

17. The SSD case of claim 16, wherein the first planar portion, the first protrusion portion, and the first plurality of fins of the first case portion are integral, and
wherein the second planar portion, the second protrusion portion, and the second plurality of fins of the second case portion are integral.

18. The SSD case of claim 16, wherein a sum of a height of the first plurality of fins and a height of the second plurality of fins is smaller than a height of the internal space.

19. A semiconductor device comprising:
- a case including a planar portion, a protrusion portion protruding from the planar portion, and a plurality of fins protruding from the planar portion, and defining an internal space and a heat dissipation slit;
- a printed circuit board including a semiconductor device and a controller, and disposed in the internal space; and
- a heat dissipation sheet covering the planar portion and the protrusion portion of the case,
- wherein the plurality of fins are disposed to be spaced apart from the protrusion portion and the printed circuit board in a first direction,
- wherein the heat dissipation slit penetrates the case in the first direction and is disposed on a sidewall of the case adjacent to the plurality of fins,
- wherein the planar portion, the protrusion portion and the plurality of fins are integral, and
- wherein an upper surface of the semiconductor device and an upper surface of the controller are in direct contact with the heat dissipation sheet.

20. The semiconductor device of claim 19, wherein the heat dissipation sheet includes at least one of graphite, graphene, carbon nanotubes, and fullerene.

* * * * *